(12) United States Patent
Takano

(10) Patent No.: US 10,777,439 B1
(45) Date of Patent: Sep. 15, 2020

(54) SUBSTRATE PROCESSING APPARATUS

(71) Applicant: KOKUSAI ELECTRIC CORPORATION, Tokyo (JP)

(72) Inventor: Satoshi Takano, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/566,284

(22) Filed: Sep. 10, 2019

(30) Foreign Application Priority Data

Mar. 14, 2019 (JP) .................................. 2019-047057

(51) Int. Cl.
*H01L 21/67* (2006.01)
*H01L 21/677* (2006.01)
*H01L 21/68* (2006.01)

(52) U.S. Cl.
CPC .... *H01L 21/67766* (2013.01); *H01L 21/6773* (2013.01); *H01L 21/67248* (2013.01); *H01L 21/67253* (2013.01); *H01L 21/67259* (2013.01); *H01L 21/67778* (2013.01); *H01L 21/68* (2013.01)

(58) Field of Classification Search
USPC ................................................. 700/245–264
See application file for complete search history.

(56) References Cited

U.S. PATENT DOCUMENTS

| | | | | |
|---|---|---|---|---|
| 5,879,459 A * | 3/1999 | Gadgil | ..................... | C23C 16/44 118/715 |
| 6,106,634 A * | 8/2000 | Ghanayem | .............. | B08B 17/02 118/719 |
| 6,582,578 B1 * | 6/2003 | Dordi | ..................... | C25D 21/00 204/212 |
| 6,860,965 B1 * | 3/2005 | Stevens | ................. | C23C 14/566 118/719 |
| 7,248,931 B2 * | 7/2007 | Raaijmakers | ......... | H01L 21/681 355/53 |
| 8,033,769 B2 * | 10/2011 | Gage | ................. | H01L 21/67196 414/217 |
| 10,605,530 B2 * | 3/2020 | Jdira | ........................ | F27B 1/14 |

(Continued)

FOREIGN PATENT DOCUMENTS

JP         2012-054399 A        3/2012

*Primary Examiner* — Jonathan L Sample
(74) *Attorney, Agent, or Firm* — Volpe and Koenig, P.C.

(57) ABSTRACT

There is provided a technique that includes: a reactor including a process chamber where substrate is processed, the reactor being fixed to a vacuum transfer chamber; a substrate mounting stand disposed in the reactor and having substrate mounting surface where the substrate is mounted; a heater heating the substrate; a gas supply part supplying gas into the process chamber; an extraction part extracting basic information for estimating position of the substrate mounting surface; a calculation part calculating estimated position information of center of the substrate mounting surface based on the basic information; a transfer robot disposed in the vacuum transfer chamber and including an end effector supporting the substrate when the substrate is transferred; and a controller performing control to set target coordinate of the end effector according to the estimated position information, move the end effector to the target coordinate, and mount the substrate on the substrate mounting surface.

6 Claims, 12 Drawing Sheets

(56) References Cited

U.S. PATENT DOCUMENTS

| | | | |
|---|---|---|---|
| 2002/0162630 A1* | 11/2002 | Satoh | H01L 21/68735 156/345.51 |
| 2003/0201184 A1* | 10/2003 | Dordi | C25D 21/00 205/80 |
| 2004/0050326 A1* | 3/2004 | Thilderkvist | C23C 16/45574 118/715 |
| 2006/0021702 A1* | 2/2006 | Kumar | H01L 21/02071 156/345.32 |
| 2006/0105114 A1* | 5/2006 | White | C23C 8/36 427/569 |
| 2006/0156979 A1* | 7/2006 | Thakur | H01L 21/6719 118/715 |
| 2007/0029046 A1* | 2/2007 | Li | H01L 21/67069 156/345.28 |
| 2008/0166208 A1* | 7/2008 | Lester | H01L 21/67051 414/217 |
| 2009/0272719 A1* | 11/2009 | Collins | H01L 21/67259 216/58 |
| 2009/0326703 A1* | 12/2009 | Presley | H01L 21/67346 700/112 |
| 2011/0117702 A1* | 5/2011 | Rietzler | H01L 23/3128 438/113 |
| 2013/0126515 A1* | 5/2013 | Shero | H05B 3/68 219/444.1 |
| 2014/0087561 A1* | 3/2014 | Lee | H01L 21/6719 438/689 |
| 2016/0340782 A1* | 11/2016 | Chandrasekharan | C23C 16/45565 |
| 2017/0004987 A1* | 1/2017 | Fairbairn | H01L 21/67259 |
| 2017/0032510 A1* | 2/2017 | Francken | H01L 21/67201 |
| 2017/0067156 A1* | 3/2017 | Leeser | H01J 37/32788 |
| 2017/0183775 A1* | 6/2017 | Yamamoto | C23C 16/345 |
| 2018/0148835 A1* | 5/2018 | Erickson | C23C 16/4411 |
| 2018/0350642 A1* | 12/2018 | Mizuguchi | H01L 21/67288 |
| 2019/0051544 A1* | 2/2019 | Verbaas | H01L 21/68785 |
| 2019/0171181 A1* | 6/2019 | Nurani | H01L 21/67253 |
| 2019/0171787 A1* | 6/2019 | Nurani | G06T 7/0006 |
| 2019/0172738 A1* | 6/2019 | Hiester | H01L 21/68 |

* cited by examiner

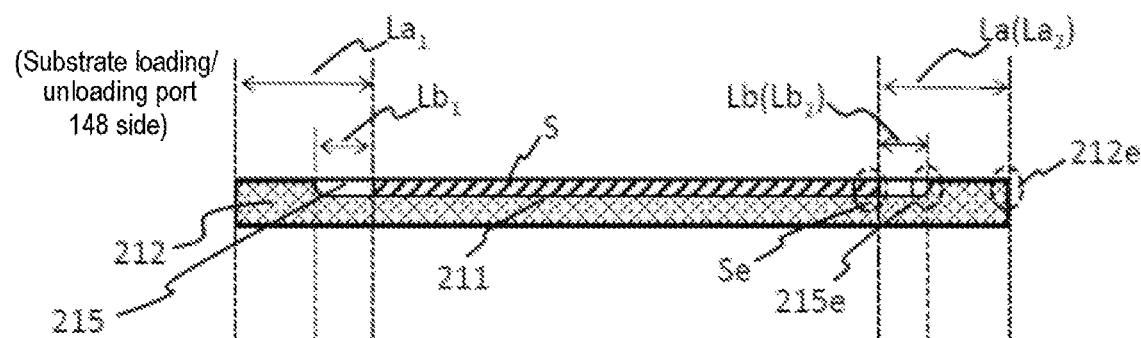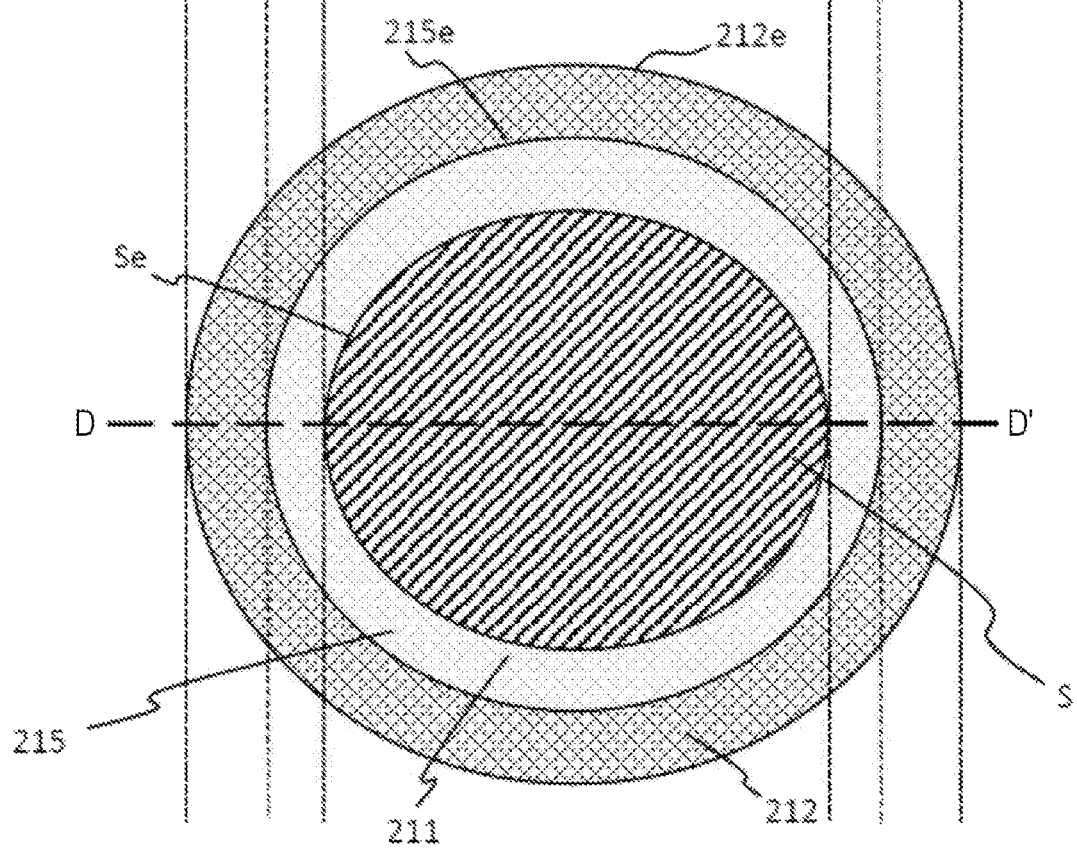

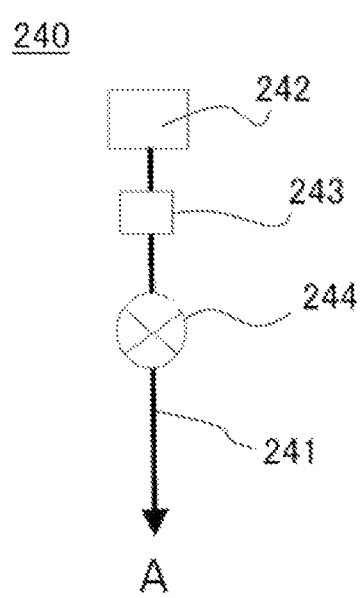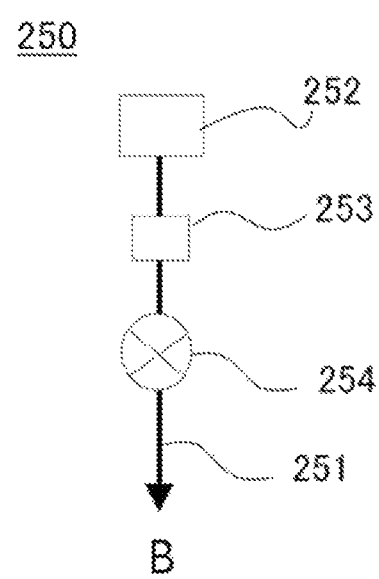

| Container temperature (basic information) | Estimated position information | Target coordinate |
|---|---|---|
| Temp. Zone 1 | — | A2 |
| ... | ... | ... |
| Temp. Zone m | B1 | B2 |
| ... | ... | ... |
| Temp. Zone n | C1 | C2 |

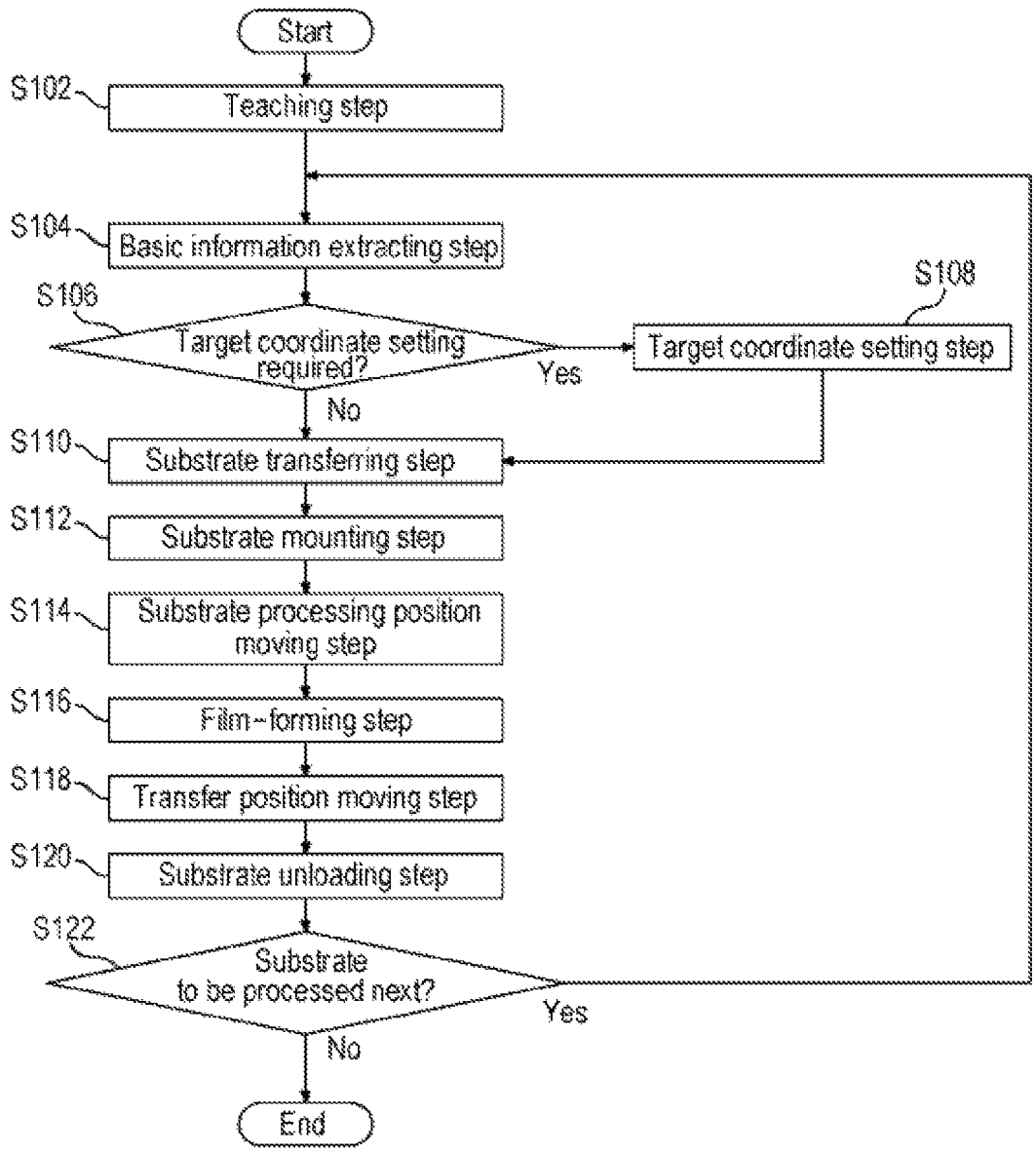

| Recipe (basic information) | Substrate temperature information | Estimated position information | Target coordinate |
|---|---|---|---|
| Recipe 1 | Temp. 1 | D1 | D2 |
| ... | ... | ... | ... |
| Recipe p | Temp. p | E1 | E2 |
| ... | ... | ... | ... |
| Recipe q | Temp. q | F1 | F2 |

US 10,777,439 B1

SUBSTRATE PROCESSING APPARATUS

CROSS-REFERENCE TO RELATED APPLICATION

This application is based upon and claims the benefit of priority from Japanese Patent Application No. 2019-047057, filed on Mar. 14, 2019, the entire contents of which are incorporated herein by reference.

TECHNICAL FIELD

The present disclosure relates to a substrate processing apparatus.

BACKGROUND

As an apparatus for manufacturing a semiconductor device, there is a single-wafer apparatus that processes substrates one by one in the related art. In the single wafer apparatus, a robot loads a substrate into a process chamber in the single-wafer apparatus and mounts the substrate on a substrate mounting surface in the process chamber. Here, for example, the substrate is heated and a gas is supplied to the substrate to form a film configured as a part of the semiconductor device.

In the case of forming a film on a substrate, it is desirable to suppress variations in a processing state in the plane of the substrate or between plural substrates.

The process chamber of the single-wafer apparatus is generally made of, for example, metal such as aluminum. Metal has a certain linear expansion coefficient depending on a temperature change. In an apparatus design including arrangement of components, it is necessary to consider the linear expansion coefficient.

However, a robot teaching operation performed after apparatus assembly is usually performed at the room temperature. Therefore, a thermal expansion state of the process chamber during a substrate processing may be different from that during a teaching operation, and the substrate may be shifted from the substrate mounting position set in the teaching operation. Due to this shift, a film of desired film quality may not be formed on the substrate.

SUMMARY

Some embodiments of the present disclosure provide a substrate processing apparatus that subjects a substrate to heat treatment, which is capable of improving a film quality of a film formed on the substrate.

According to one embodiment of the present disclosure, there is provided a technique that includes: a reactor including a process chamber in which a substrate is processed, the reactor being fixed to a vacuum transfer chamber; a substrate mounting stand disposed in the reactor and having a substrate mounting surface on which the substrate is mounted; a heater configured to heat the substrate; a gas supply part configured to supply a gas into the process chamber; an extraction part configured to extract basic information for estimating a position of the substrate mounting surface; a calculation part configured to calculate estimated position information of a center of the substrate mounting surface based on the basic information; a transfer robot disposed in the vacuum transfer chamber and including an end effector supporting the substrate when the substrate is transferred; and a controller configured to perform control to set a target coordinate of the end effector according to the estimated position information, move the end effector to the target coordinate, and mount the substrate on the substrate mounting surface.

BRIEF DESCRIPTION OF DRAWINGS

FIGS. 4A and 4B are explanatory views for explaining a substrate mounting stand.
FIG. 5 is an explanatory view for explaining a gas supply part.
FIG. 6 is an explanatory view for explaining a gas supply part.
FIG. 8 is an explanatory diagram for explaining a coordinate table.
FIG. 10 is a flowchart for explaining a substrate processing process.
FIG. 13 is an explanatory view for explaining a coordinate table.

DETAILED DESCRIPTION

Embodiments will be now described with reference to the drawings.

First Embodiment

Figure 1:
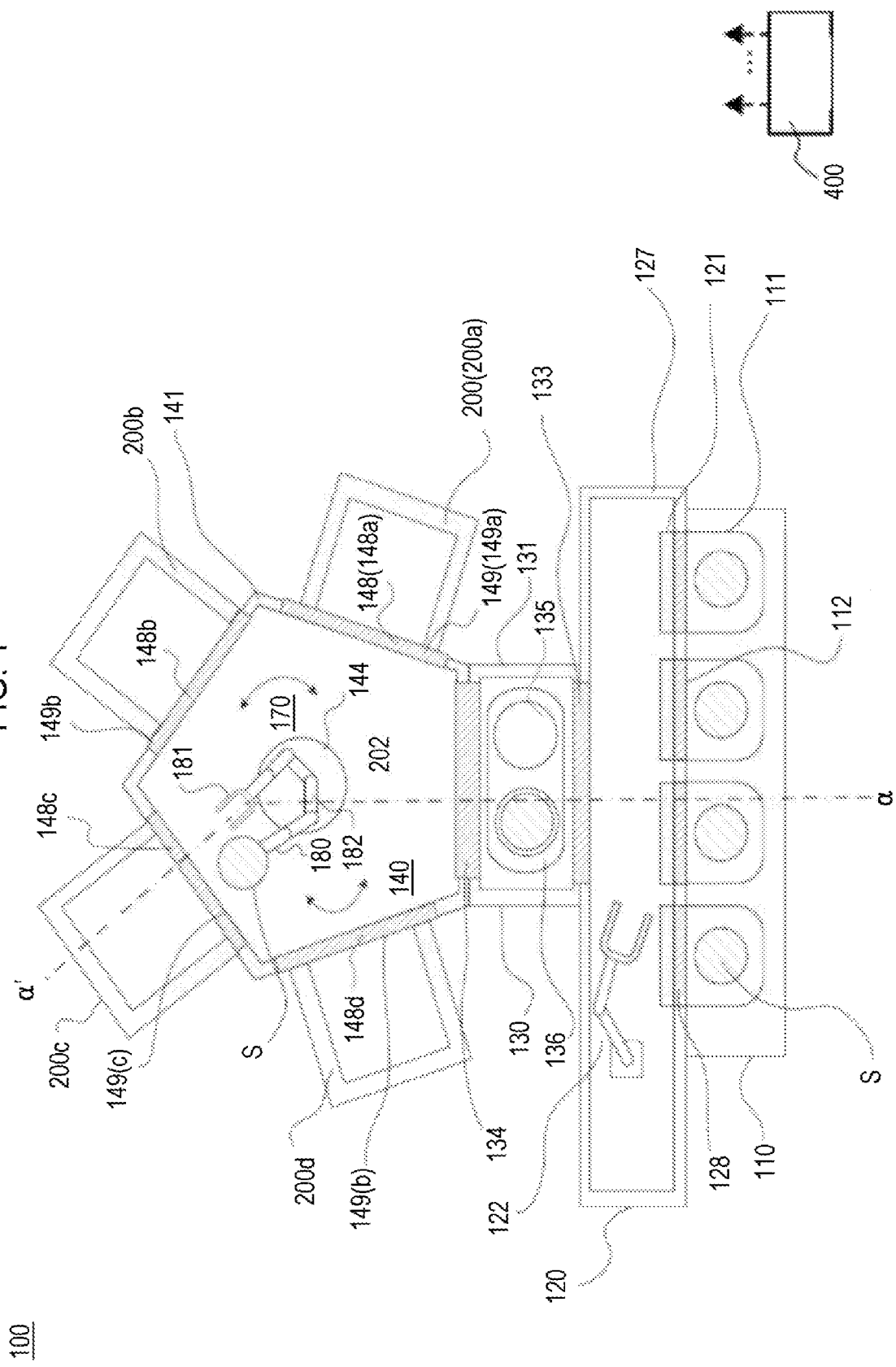
FIG. 1 is an explanatory view for explaining a substrate processing apparatus.
Figure 2:
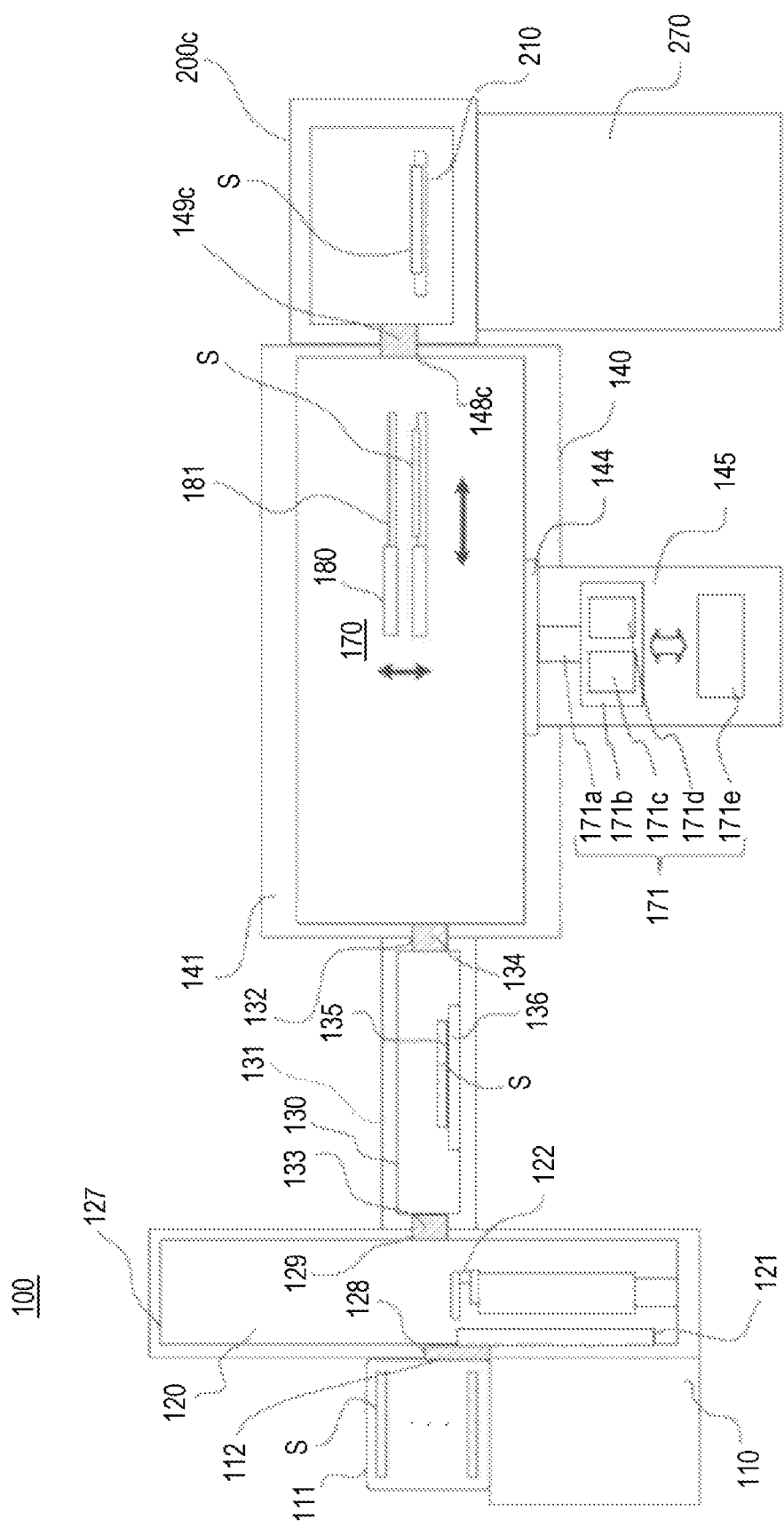
FIG. 2 is an explanatory view for explaining a substrate processing apparatus.
Figure 3:
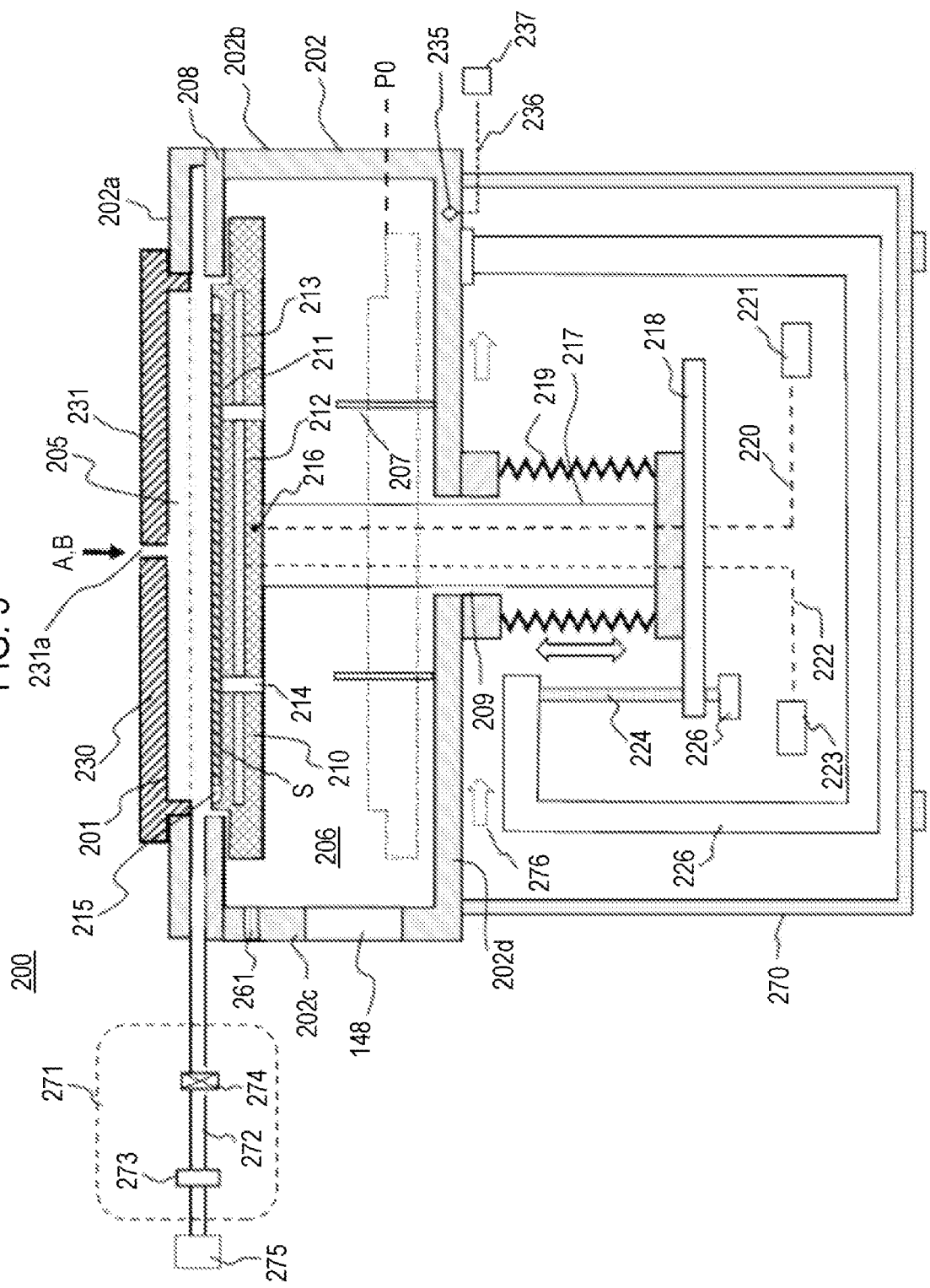
FIG. 3 is an explanatory view for explaining a substrate processing apparatus.

A first embodiment will be described.
(1) Configuration of Substrate Processing Apparatus
A schematic configuration of a substrate processing apparatus according to an embodiment of the present disclosure will be described with reference to FIGS. 1 to 6. FIG. 1 is a cross-sectional view showing a configuration example of a substrate processing apparatus according to the present embodiment. FIG. 2 is a longitudinal sectional view taken along line a-a' in FIG. 1, showing a configuration example of a substrate processing apparatus according to the present embodiment. FIG. 3 is an explanatory view for explaining a reactor (RC) 200 according to the present embodiment. FIGS. 4A and 4B are explanatory views for explaining a state in which a substrate S is mounted on a substrate mounting stand 212. FIGS. 5 to 6 are explanatory views for explaining a gas supply part connected to the RC 200.

In FIGS. 1 and 2, a substrate processing apparatus 100 to which the present disclosure is applied is to process a substrate S and mainly includes an IO stage 110, an atmosphere transfer chamber 120, a load lock chamber 130, a vacuum transfer chamber 140 and an RC 200.
(Atmosphere Transfer Chamber and IO Stage, i.e., Automated Wafer Transfer System)
The IO stage (load port) 110 is installed in front of the substrate processing apparatus 100. A plurality of pods 111 is mounted on the IO stage 110. Each pod 111 is used as a carrier for transferring a substrate S such as a silicon (Si) substrate.

The pod 111 is provided with a cap 112 which is opened/closed by a pod opener 121. The pod opener 121 opens/closes the cap 112 of the pod 111 mounted on the IO stage 110 and opens/closes a substrate entrance to enable loading/unloading of the substrate S in/from the pod 111. The pod 111 is supplied/discharged to/from the IO stage 110 by an AMHS (Automated Material Handling Systems) (not shown).

The IO stage 110 is adjacent to the atmosphere transfer chamber 120. The atmosphere transfer chamber 120 is connected to a load lock chamber 130 (which will be described later) at its surface opposite to the IO stage 110. An atmosphere transfer robot 122 for transferring the substrate S is installed in the atmosphere transfer chamber 120.

A substrate loading/unloading port 128 for loading/unloading the substrate S into/from the atmosphere transfer chamber 120, and the pod opener 121 are installed on the front side of a housing 127 of the atmosphere transfer chamber 120. A substrate loading/unloading port 129 for loading/unloading the substrate S into/from the load lock chamber 130 is installed on the rear side of the housing 127 of the atmosphere transfer chamber 120. The substrate loading/unloading port 129 enables the loading/unloading of the substrate S by being opened/closed by a gate valve 133.
(Load Lock Chamber)

The load lock chamber 130 is adjacent to the atmosphere transfer chamber 120. A vacuum transfer chamber 140, which will be described later, is disposed on a surface, which is opposite to the atmosphere transfer chamber 120, among surfaces of a housing 131 forming the load lock chamber 130.

A substrate mounting stand 136 having at least two mounting surfaces 135 on which the substrate S is mounted is installed in the load lock chamber 130. The interior of the load lock chamber 130 communicates with the vacuum transfer chamber 140 via a transfer port 132. A gate valve 134 is installed in the transfer port 132.
(Vacuum Transfer Chamber)

The substrate processing apparatus 100 includes the vacuum transfer chamber (transfer module) 140 as a transfer chamber which is a transfer space into which the substrate S is transferred under a negative pressure. A housing 141 forming the vacuum transfer chamber 140 is formed in a shape of pentagon when seen in plane view, and the load lock chamber 130 and the reactor (RC) 200 (RC 200a to RC 200d) for processing the substrate S are respectively fixed to sides of the pentagon. A transfer robot 170 as a transfer part for transferring the substrate S under a negative pressure is installed at approximately the center of the vacuum transfer chamber 140 with a flange 144 as a base.

The vacuum transfer robot 170 installed in the vacuum transfer chamber 140 is configured to move up and down while maintaining the airtightness of the vacuum transfer chamber 140 by an elevator 145 and the flange 144. Two arms 180 of the robot 170 are configured to be able to move up and down. The tip of each of the arms 180 is provided with an end effector 181 supporting the substrate S. Each arm 180 has a link structure 182. The arms 180 are constituted by a plurality of link structures 182 and end effectors 181. In FIG. 2, for the sake of convenience of description, the arms 180 and the end effectors 181 are shown and other structures are omitted.

A substrate loading/unloading port 148 is installed on each of side walls of the housing 141 facing the respective RCs 200. For example, as shown in FIG. 2, a substrate loading/unloading port 148c is installed on the side wall facing the RC 200c. Further, a gate valve 149 is provided for each RC 200. A gate valve 149c is installed at the RC 200c. Since the RCs 200a, 200b, and 200d have the same configuration as the RC 200c, explanation thereof will not be repeated.

An arm control part 171 that controls elevation and rotation of the arm 180 is incorporated in the elevator 145. The arm control part 171 mainly includes a support shaft 171a that supports an axis of the arm 180, and an actuation part 171b that elevates or rotates the support shaft 171a. A hole is formed in the flange 144 between the axis of the arm 180 and the support shaft 171a, and the support shaft 171a is configured to directly support the axis of the arm 180.

The actuation part 171b includes, for example, an elevation mechanism 171c including a motor for achieving the elevation, and a rotation mechanism 171d such as a gear for rotating the support shaft 171a. In addition, as a part of the arm control part 171, an instruction part 171e for instructing the actuation part 171b for elevation and rotation may be installed at the elevator 145. The instruction part 171e is electrically connected to a controller 400. The instruction part 171e controls the actuation part 171b based on an instruction from the controller 400. The instruction part is also called an arm control part.

The arm control part 171 controls the arm 180 to enable rotation and extension of the end effector 181. The rotation and extension is performed to load/unload the substrate S into/from the RC 200. Further, according to an instruction from the controller 400, a wafer can be transferred to a designated RC 200.

As shown in FIG. 2, a support 270 for supporting the RC 200 is installed on each RC 200. The support 270 is formed of, for example, a plurality of columns, and has flexibility so that it can support the RC 200 even when the RC 200 is expanded by thermal expansion.

Here, the reason why the support 270 has the flexibility will be described. As described above, the RC 200 is fixed to the vacuum transfer chamber 141. Generally, the vacuum transfer chamber 141 is fixed to the floor because it is connected to another RC 200 or has the robot 170. Therefore, as will be described later, when the RC 200 is thermally expanded, it may expand in a direction opposite to the transfer chamber 141 with respect to the vacuum transfer chamber 141. In such a state, when the RC 200 is fixed so as not to move, a damage to the support 270 and the like may be caused. Therefore, the support 270 has the flexibility so as not to be damaged even when the RC 200 expands.
(Reactor)

Next, the RC 200 will be described with reference to FIGS. 3 to 6. The RCs 200a to 200d have the same configuration, and therefore, description will be here given of the RC 200 as a representative.

FIG. 3 is a longitudinal sectional view of the RC 200. FIGS. 4A and 4B are views for explaining the substrate mounting stand 212, FIG. 4A being a longitudinal sectional view of the substrate mounting stand 212, and FIG. 4B being a view of the substrate mounting stand 212 as viewed from above. FIG. 5 is a view for explaining a first gas supply part to be described later, and FIG. 6 is a view for explaining a second gas supply part to be described later, respectively.

As shown in FIG. 3, the RC 200 includes a container 202. The container 202 is configured as, for example, a flat sealed container having a circular cross section. The container 202 is made of, for example, a metal material such as aluminum (Al) or stainless steel (SUS). In the container 202 are formed a process chamber 201 constituting a processing space 205 for processing a substrate S such as a silicon wafer, and a transfer chamber 206 having a transfer space through which the substrate S passes when transferring the substrate S to the processing space 205. The container 202 is constituted by an upper container 202a and a lower container 202b. A partition plate 208 is interposed between the upper container 202a and the lower container 202b.

The side wall 202c of the lower container 202b is directly or indirectly fixed to the substrate loading/unloading port 148 adjacent to the gate valve 149, and the substrate S is moved between the vacuum transfer chambers 140 and the lower container 202b via the substrate loading/unloading port 148. A plurality of lift pins 207 are installed at the bottom of the lower container 202b.

A substrate support 210 for supporting the substrate S is disposed in the processing space 205. The substrate support 210 mainly includes a substrate mounting surface 211 on which the substrate S is mounted, a substrate holder 215 having the substrate mounting surface 211 on its surface, a substrate mounting stand 212 on which the substrate holder 215 is installed, and a heater 213 as a heating part installed at the substrate mounting stand 212.

The substrate mounting stand 212 is made of aluminum nitride, quartz or the like. The substrate mounting stand 212 is configured in a circumferential shape when viewed from above, as shown in FIG. 4B. The center of the substrate holder 215 is arranged to overlap with the center of the substrate mounting stand 212. The substrate mounting surface 211 is similarly configured in a circumferential shape when viewed from above. The center of the substrate mounting surface 211 is arranged to overlap with the center of the substrate mounting stand 212.

Through-holes 214 through which lift pins 207 pass are installed in the substrate mounting stand 212 at positions corresponding to the lift pins 207, respectively. The through-holes 214 are not shown in FIGS. 4A and 4B.

The substrate holder 215 is installed on the substrate mounting stand 212 so as to face a gas introduction hole 231a. The substrate holder 215 has a concave structure, and the substrate mounting surface 211 is on the bottom surface of the concave structure.

The diameter of the substrate holder 215 is larger than the diameter of the substrate S to be mounted. Therefore, the substrate S is placed on the bottom of the concave structure. Since the substrate S is disposed on the bottom of the concave structure, it is unlikely to be affected by a gas flow due to the structure around the substrate mounting stand 212. For example, a gas flow rate on the side of an exhaust pipe 272 is slightly smaller than that on the other sides in an upper surface of the substrate mounting stand 212, but a bottom surface of the substrate mounting stand 212 is not easily affected. Therefore, it is easy to control a supply amount of a processing gas supplied to the substrate S.

When the substrate S is mounted, an arm control part 171 controls the arm 180 so that the end effector 181 can be moved to a target coordinate. The target coordinate is a radial center of the substrate mounting surface 211 and is a coordinate at which a center position of the substrate S overlaps with a center position of the substrate mounting surface 211.

This will be described with reference to FIGS. 4A and 4B. FIG. 4A is a side sectional view of the substrate mounting stand 212 and FIG. 4B is a top view thereof. FIG. 4A is a cross-sectional view taken along line D-D' in FIG. 4B. Se denotes an edge of the substrate S. The edge Se is configured in the circumferential direction of the substrate S. 215e denotes an edge of the substrate holder 215 on the side facing the edge Se of the substrate S. Similar to the edge Se, the edge 215e is configured in the circumferential direction. 212e denotes an outer peripheral side edge of the substrate mounting stand 212.

La denotes a distance between the edge Se and the edge 212e. $La_1$ denotes a distance La on the side of the substrate loading/unloading port 148, and $La_2$ denotes a distance La on the side different from the side of the substrate loading/unloading port 148.

Lb denotes a distance between the edge Se and the edge 215e. $Lb_1$ denotes a distance Lb on the side of the substrate loading/unloading port 148, and $Lb_2$ denotes a distance Lb on the side different from the side of the substrate loading/unloading port 148.

The arm control part 171 causes the end effector 181 to reach the target coordinate, whereby the substrate S is placed so as to make the distances La and Lb constant in the circumferential direction, as shown in FIGS. 4A and 4B.

By keeping the distance La constant, it is possible to make the same turbulent state in a space between the edge Se and the edge 212e in the circumferential direction. Therefore, the circumferential processing of the substrate S can be made uniform.

Further, by keeping the distance Lb constant, it is possible to make the same turbulent state in a space between the edge Se and the edge 215e in the circumferential direction. Therefore, the circumferential processing of the substrate S can be made more uniform.

Even when processing other substrates S, the same processing can be uniformly performed among a plurality of substrates S by making La and Lb constant.

The substrate mounting stand 212 includes a temperature measuring device 216 which is a first temperature measuring device for measuring a temperature of the heater 213. The temperature measuring device 216 is connected to a temperature measurement part 221, which is a first temperature measurement part, via a wiring 220.

A wiring 222 for supplying power is connected to the heater 213. The wiring 222 is connected to a heater control part 223.

The temperature measurement part 221 and the heater control part 223 are electrically connected to the controller 400 to be described later. The controller 400 transmits control information to the heater control part 223 based on temperature information measured by the temperature measurement part 221. The heater control part 223 refers to the received control information to control the heater 213.

The substrate mounting stand 212 is supported by a shaft 217. The shaft 217 passes through a hole 209 of the bottom 202d of the container 202 and is connected to a shaft support 218 outside the container 202. The shaft 217 is made of, for example, aluminum nitride or the like.

The shaft support 218 is connected to an elevating shaft 224. A motor 225 is connected to the elevating shaft 224. The motor 225 rotates the elevating shaft 224 to raise and lower the shaft support 218. The elevating shaft 224 is fixed to an elevating shaft support 226. The elevating shaft support 226 is fixed to the bottom 202d. The periphery of the lower end portion of the shaft 217 is covered by a bellows 219, whereby the interior of the processing space 205 is kept airtight.

By the way, when the container 202 is thermally expanded, the container 202 extends in the direction of an arrow 276 opposite to the vacuum transfer chamber 141 as described above. When the container 202 is heated, the positions of the shaft 217 and the substrate mounting stand 212 fixed thereto are shifted. Specifically, when the bottom 202d extends in the direction of the arrow 276 due to heating, the position of the elevating shaft support 226 fixed to the bottom 202d is shifted in the direction of the arrow. Along with this, the position of the shaft support 218 fixed to the elevating shaft support 226 is shifted to the arrow 276. Along with the position shift, since the center position of the substrate mounting surface 211 is also shifted, it is also shifted from a target coordinate at the time of teaching.

The shaft 217 and the substrate mounting stand 212 made of ceramic or quartz have a thermal expansion coefficient significantly lower than that of the metal container 202, and their thermal expansion is very small. That is, when heated, influence of the thermal expansion of the container 202 is dominant. Therefore, the shaft 217 and the substrate mounting stand 212 do not follow the thermal expansion of the metal as described above. Therefore, an amount of shift from the target coordinate becomes more remarkable.

The process chamber 201 includes, for example, a buffer structure 230 to be described later, and the substrate mounting stand 212. The process chamber 201 may have another structure as long as the processing space 205 for processing the substrate S can be secured.

When transferring the substrate S, the substrate mounting stand 212 moves down to a transfer position P0 at which the substrate mounting surface 211 faces the substrate loading/unloading port 148. When processing the substrate S, the substrate mounting stand 212 moves up to a processing position of the substrate S in the processing space 205, as shown in FIG. 3.

The buffer structure 230 for gas diffusion is installed above the processing space 205 (upstream side). The buffer structure 230 is mainly constituted by a lid 231.

The lid 231 communicates with a first gas supply unit 240 and a second gas supply unit 250, which will be described later, so as to communicate with a gas introduction hole 231a installed in the lid 231. The reference numeral "A" shown in FIG. 3 corresponds to the reference numeral "A" shown in FIG. 5, and the reference numeral "B" shown in FIG. 3 corresponds to the reference numeral "B" shown in FIG. 6, which mean that gas supply parts are connected respectively. Although only one gas introduction hole 231a is shown in FIG. 3, a gas introduction hole may be installed for each gas supply part.

A temperature measuring device 235 is installed at the bottom 202d of the container 202. The temperature measuring device 235 is connected to a temperature measurement part 237, which is a second temperature measurement part, via a wiring 236. The temperature measuring device 235 detects the temperature of the container 202, particularly the temperature of the bottom 202d. As will be described later, since the detected temperature is also used to detect the position of the substrate mounting surface 211, the temperature measuring device 235 is also called a position detection part.

(First Gas Supply Part)

Next, the first gas supply part 240 will be described with reference to FIG. 5. A first gas source 242, a mass flow controller (MFC) 243, which is a flow rate controller (flow rate control part), and a valve 244, which is an opening/closing valve, are installed on a first gas supply pipe 241 in this order from the upstream side.

The first gas source 242 is a source of a first gas containing a first element (also referred to as a "first element-containing gas"). The first element-containing gas is a precursor gas, that is, one of processing gases. Here, the first element is, for example, silicon (Si). That is, the first element-containing gas is, for example, a silicon-containing gas. Specifically, a monosilane ($SiH_4$) gas is used as the silicon-containing gas.

The first gas supply part 240 (also referred to as a silicon-containing gas supply system) is mainly constituted by the first gas supply pipe 241, the mass flow controller 243 and the valve 244.

(Second Gas Supply Part)

Next, the second gas supply part 250 will be described with reference to FIG. 6. A second gas source 252, a mass flow controller (MFC) 253, which is a flow rate controller (flow rate control part), and a valve 254, which is an opening/closing valve, are installed on a second gas supply pipe 251 in this order from the upstream side.

The second gas source 252 is a source of a second gas containing a second element (also referred to as a "second element-containing gas"). The second element-containing gas is one of processing gases. The second element-containing gas may be considered as a reactive gas or a reforming gas.

Here, the second element-containing gas contains the second element different from the first element. The second element is, for example, any one of oxygen (O), nitrogen (N) and carbon (C). Here, the second element-containing gas will be described with, for example, an oxygen-containing gas. Specifically, an oxygen gas ($O_2$) is used as the oxygen-containing gas.

The second gas supply part 250 (also referred to as a reactive gas supply system) is mainly constituted by the second gas supply pipe 251, the mass flow controller 253 and the valve 254.

When a film is formed on the substrate S by the first gas alone, the second gas supply part 250 may be excluded.

The first gas supply part 240 and the second gas supply part 250 described above are collectively called a gas supply part.

(Exhaust Part)

An exhaust part 271 will be described with reference to FIG. 3. An exhaust pipe 272 communicates with the processing space 205. The exhaust pipe 272 is connected to the upper container 202a so as to communicate with the processing space 205. An APC (Auto Pressure Controller) 273 which is a pressure controller that controls the interior of the processing space 205 to a predetermined pressure is installed at the exhaust pipe 272. The APC 273 has a valve body (not shown) whose opening degree can be adjusted, and adjusts the conductance of the exhaust pipe 272 according to an instruction from the controller 400. Further, a valve 274 is installed at the exhaust pipe 272 in the upstream side of the APC 273. The exhaust pipe 272, the valve 274 and the APC 273 are collectively referred to as an exhaust part.

Furthermore, a DP (Dry Pump) 275 is installed at the downstream side of the exhaust pipe 272. The DP 275 exhausts the atmosphere of the processing space 205 via the exhaust pipe 272.

(Controller)

Figure 7:
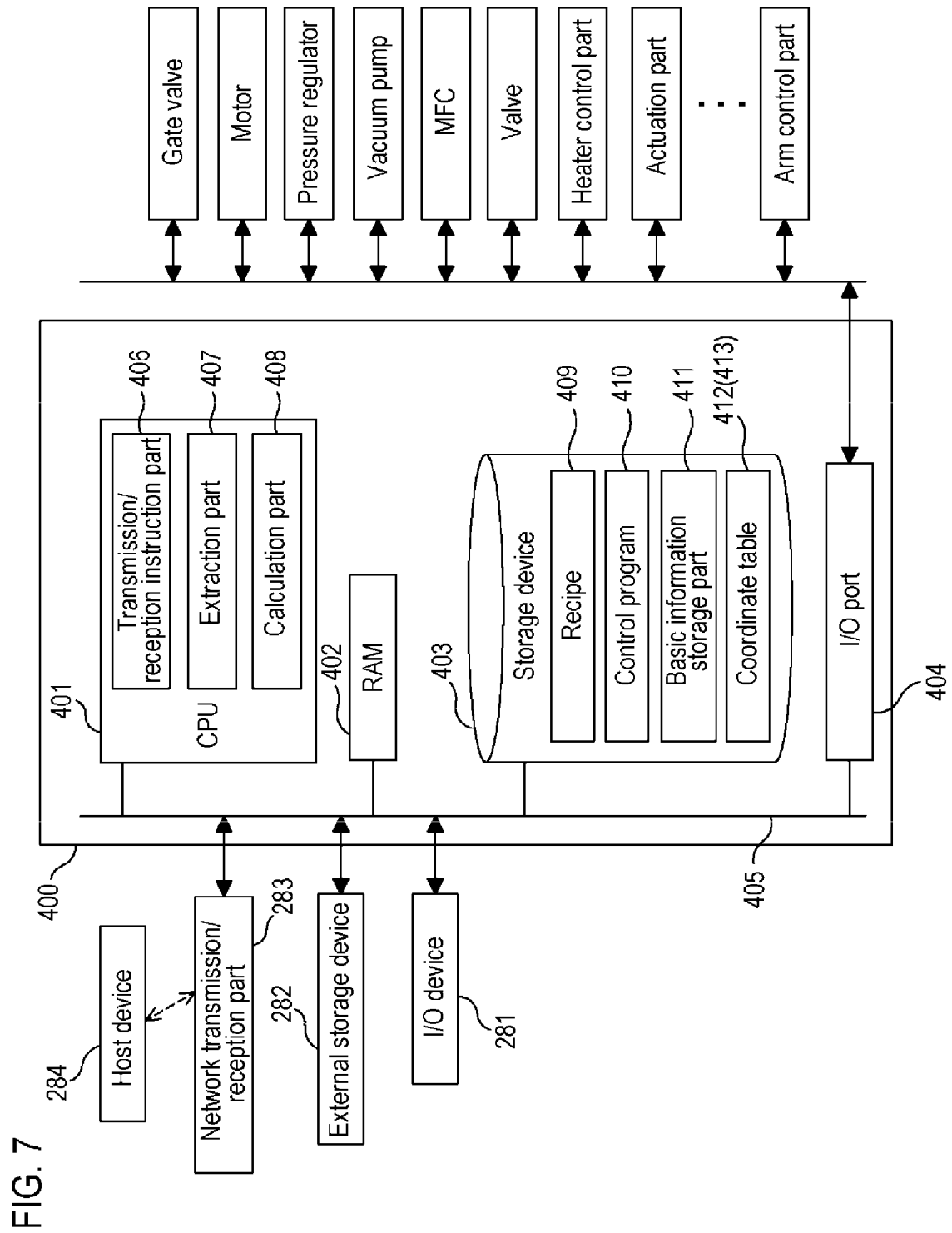
FIG. 7 is an explanatory view for explaining a controller of a substrate processing apparatus.

Next, a controller 400 will be described with reference to FIG. 7. The substrate processing apparatus 100 includes the controller 400 that controls operations of various parts.

The controller 400, which is a control part (control means), is configured as a computer including a central processing unit (CPU) 401, a random access memory (RAM) 402, a storage part 403 as a memory device, and an I/O port 404. The RAM 402, the storage part 403 and the I/O port 404 are configured to be able to exchange data with the CPU 401 via an internal bus 405. Transmission/reception of data in the substrate processing apparatus 100 is performed according to an instruction from a transmission/reception instruction part 406 which is also a function of the CPU 401.

The CPU 401 further includes an extraction part 407 and a calculation part 408. The extraction part 407 has a role of extracting basic information to be described later and storing the basic information in a basic information storage part 411. The calculation part 408 has a role of analyzing a relationship between the basic information storage part 411 to be described later and a coordinate table 412 and calculating a target coordinate of the end effector 181.

Further, a network transmission/reception part 283 connected to a host device 284 via a network is installed. The network transmission/reception part 283 can receive a processing history of the substrate S in the lot, substrate processing information on a recipe and the like to be executed, and the like.

The storage part 403 is configured by, for example, a flash memory, a hard disk drive (HDD) or the like. Process recipes 409 in which procedures and conditions of the substrate processing are described and a control program 410 for controlling the operation of the substrate processing apparatus are readably stored in the storage part 403. Further, the storage part 403 includes a basic information storage part 411 storing basic information such as temperature data measured by the temperature measurement parts 221 and 237, and a coordinate table 412 indicating a relationship between the basic information and the target coordinate of the end effector 181.

The process recipes are combined to obtain a predetermined result by causing the controller 400 to execute the respective procedures in the substrate processing process to be described later, and function as a program. Hereinafter, the process recipes and the control program are collectively referred to simply as a program. In the present disclosure, the term "program" may include only a process recipe, only a control program, or both. Further, the RAM 402 is configured as a memory area (work area) in which programs, data and the like read by the CPU 401 are temporarily held.

The I/O port 404 is connected to the gate valve 149, the motor 225, the pressure regulators, the pumps, the heater control part 223, the arm control part 171, and various components of the substrate processing apparatus 100.

The CPU 401 is configured to read and execute the control program from the storage part 403 and to read the process recipes from the storage part 403 in response to an input of an operation command from the input/output device 281. Then, the CPU 401 can control the opening/closing operation of the gate valve 149, the operation of the motor 225, the temperature measurement parts 221 and 237, the heater control part 223, on/off control of the pumps, the flow rate adjusting operation of the mass flow controllers, the valves and so on according to the contents of the read process recipes.

Further, based on the information of the coordinate table 412 to be described later, the CPU 401 controls the actuation part 171*b* and the instruction part 171*e* and controls intrusion position of the arm. The coordinate table 412 will be described in detail later.

The controller 400 according to this technique can be configured by installing the program in a computer using an external storage device 282 (for example, a magnetic disk such as a hard disk, an optical disk such as a DVD, a magneto-optical disk such as an MO, or a semiconductor memory such as a USB memory) storing the above-mentioned program. The means for supplying the program to the computer is not limited to being supplied via the external storage device 282. For example, a communication means such as Internet or a dedicated line may be used to supply the program without going through the external storage device 282. Further, the storage part 403 and the external storage device 282 are configured as a computer-readable recording medium. Hereinafter, these are collectively referred to simply as a recording medium. In the present disclosure, when the term "recording medium" is used, it may include the storage part 403 alone, the external storage device 282 alone, or both.

Next, the coordinate table 412 will be described with reference to FIG. 8. The coordinate table 412 shows the relationship among the temperature of the container 202 as the basic information, an estimated position coordinate which is the center coordinate of the substrate holder 215 moved by thermal expansion, and the target coordinate of the end effector 181. The temperature of the container 202 is, for example, the temperature of the bottom 202*d*. The target coordinate is a coordinate for the end effector 181 to place the substrate S on the center of the substrate holder 215.

Each of "Temp Zone 1" to "Temp Zone m" to "Temp Zone n" described as the container temperature has a constant width (for example, every 50 degrees C.). Temp Zone 1 is an initial temperature, which is a temperature at which thermal expansion does not occur. Therefore, in the processing of the first substrate S, a target coordinate A2 is set for the robot 170. The reference numerals m and n are arbitrary numbers, and the temperature is set according to a process. It is assumed that m is smaller than n. Further, it is assumed that "Temp Zone m" is smaller than "Temp Zone n."

Here, as a result of careful research by the present inventors, it has been found that the temperature of the container 202 and the positional shift amount of the substrate mounting surface 211 have a certain relationship. As described above, this is because, since the expansion direction due to thermal expansion is constant, when the temperature of the container 202 is detected, the center position of the substrate mounting surface 211 after thermal expansion can be determined automatically.

When the substrate mounting surface 211 is shifted due to thermal expansion, the target coordinate is reset using the coordinate table 412 so that the end effector 181 always transfers the substrate S to the center coordinate of the substrate mounting surface 211.

By resetting the target coordinate in this way, since the distances $La_1$ and $La_2$ can be equal to each other and the distances $Lb_1$ and $Lb_2$ can be equal to each other, even when the substrate mounting surface 211 is shifted due to thermal expansion, the influence of a gas on the edge Se can be equalized. Therefore, an in-plane film thickness uniformity can be improved. Further, when a plurality of substrates is processed, a film thickness uniformity between the substrates can be improved.

Figure 9A:
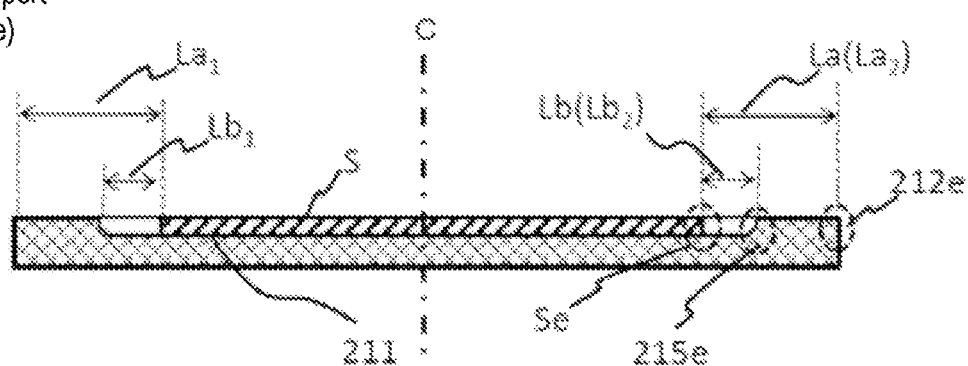
FIGS. 9A and 9B are explanatory views for explaining a comparative example.
Figure 9B:
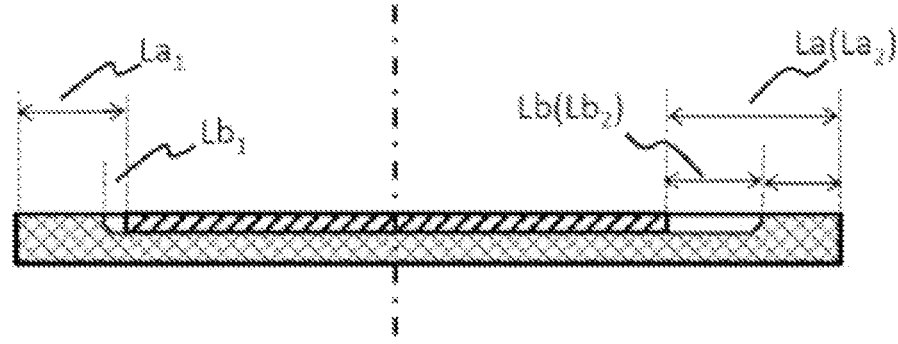

Next, as a comparative example, a problem of an apparatus which does not have the coordinate table 412 will be described with reference to FIGS. 9A and 9B. FIGS. 9A and 9B are explanatory views for explaining a state of the substrate mounting surface 211 when the container 202 is thermally expanded. In FIGS. 9A and 9B, the side wall 202*c* is disposed on the left side of the figure, but its illustration is omitted.

FIG. 9A shows a state where the substrate mounting surface 211 is not affected by thermal expansion, which is the same state as FIG. 4A. FIG. 9B shows a state where the container 202 is thermally expanded and the substrate mounting stand 212 having the substrate mounting surface 211 is shifted in the direction opposite to the substrate loading/unloading port 148. A dotted line C indicates the center of the substrate S.

In typical, the robot 170 is controlled to be transferred such that the coordinate of the center C of the substrate S overlaps with the coordinate of the center of the substrate mounting surface 211, as shown in FIG. 9A. Therefore, the distances $La_1$ and $La_2$ become equal to each other. Further, the distances $Lb_1$ and $Lb_2$ become equal to each other. The operation of overlapping the coordinates is adjusted by a teaching operation when installing the apparatus in, for example, a clean room.

As described above, when the heating treatment is performed, the position of the substrate mounting stand 212, that is, the position of the substrate mounting surface 211, may be shifted.

In the comparative example, since the coordinate table 412 does not exist, the arm 180 is controlled to place the substrate at the target coordinate before thermal expansion. Therefore, when the position of the substrate mounting surface 211 is shifted, the arm 180 places the substrate S at a position shifted from the center of the substrate holder 215, as shown in FIG. 9B. In such a case, the following problem occurs.

For example, the distance $La_1$ becomes different from the distance $La_2$, and the distance $Lb_1$ becomes different from the distance $Lb_2$. In FIG. 9B, the distance $La_1$ is smaller than the distance $La_2$, and the distance $Lb_1$ is smaller than the distance $Lb_2$.

When a gas is supplied in the state as shown in FIG. 9A, the distances $La_1$ and $La_2$ are equal to each other, and the distances $Lb_1$ and $Lb_2$ are equal to each other. Therefore, since the turbulent state may be made equal around the substrate S, the substrate S can be processed uniformly.

However, when a gas is supplied in the state as shown in FIG. 9B, the distance $La_1$ is different from the distance $La_2$, and the distance $Lb_1$ is different from the distance $Lb_2$. Therefore, the turbulent state becomes different around the substrate S. That is, the substrate S cannot be processed uniformly.

Such a situation reduces the in-plane film thickness uniformity of the substrate S, which leads to significant reduction in yield.

Therefore, the present technique provides the coordinate table 412 and controls the robot 170 based on information of the coordinate table 412. Here, the robot 170 is controlled to transfer the substrate S to the center coordinate of the substrate mounting surface 211. By doing this, since the distances $La_1$ and $La_2$ can be equal to each other, and the distances $Lb_1$ and $Lb_2$ can be equal to each other, even when the substrate mounting surface 211 is shifted due to thermal expansion, the turbulent state at the edge Se may be made equal. Therefore, the in-plane film thickness uniformity can be improved and further, the film thickness uniformity among a plurality of substrates can be improved.

(2) Substrate Processing Process

Next, as one of semiconductor manufacturing processes, a process of forming a film on the substrate S using the substrate processing apparatus 100 will be described with reference to FIG. 10. In the following description, the controller 400 controls the operations of various components of the substrate processing apparatus.

Here, a substrate processing method in one RC 200 will be described as an example.

(Teaching Step S102)

A teaching step S102 will be described. Here, the trajectory and target coordinate of the end effector 181 are adjusted in a state in which the heater 213 is not in operation, that is, in a state in which the substrate S is not yet processed. Specifically, the arm 180 is operated to learn the operation of the arm 180 so that the substrate S is mounted on the substrate mounting surface 211. At this time, the target coordinate of the end effector 181 is a coordinate at which the center of the substrate S to be transferred overlaps with the center of the substrate mounting surface 211. The target coordinate at this time is an initial coordinate A2 to be described later.

(Basic Information Extracting Step S104)

The basic information extraction step S104 will be described. Here, the basic information for determining whether or not the center of the substrate mounting surface 211 is shifted from the initial coordinate A2 is extracted. The basic information is, for example, the temperature of the container 202. The extracted basic information is stored in the basic information storage part 411.

(Determining Step S106)

A determining step S106 will be described. Here, it is determined whether to reset the target coordinate of the end effector 181. Specifically, when a temperature detected in the basic information extracting step S104 is higher than the range of "Temp Zone 1" which is the temperature range of the initial setting, it is determined that the thermal expansion level has an effect on the yield and it is necessary to reset the target coordinate, and the process proceeds to a target coordinate setting step S108.

When the detected temperature is equal to or lower than the range of "Temp Zone 1", it is determined that the thermal expansion level does not have an effect on the yield and it is unnecessary to reset the target coordinate, and the process proceeds to a substrate transferring step S110. At this time, the initial coordinate A2 is maintained in the substrate transferring step S110.

(Target Coordinate Setting Step S108)

The target coordinate setting step S108 will be described. When a result of the determination in the determining step S106 is "Yes," the process proceeds to the target coordinate setting step S108. Here, the calculation part 408 uses the coordinate table 412 to calculate the target coordinate of the end effector 181 corresponding to the value detected in the basic information extracting step S104. For example, when the temperature detected in the basic information extracting step S104 is in the range of "Temp Zone m," the estimated position information of the substrate holder 215 is estimated as B1, and a target coordinate B2 corresponding to the estimated position information B1 is calculated. After setting the calculated target coordinate B2, the process proceeds to the substrate transferring step S110.

(Substrate Transferring Step S110)

The substrate transferring step S110 will be described. When the target coordinate setting step S108 is ended, or when a result of the determination in the determining step S106 is "No," the process proceeds to the substrate transferring step S110.

Here, the substrate mounting stand 212 is lowered to the transfer position (transfer position P0) of the substrate S, whereby the lift pins 207 pass through the through-holes 214 of the substrate mounting stand 212. As a result, the lift pins 207 project from the surface of the substrate mounting stand 212 by a predetermined height. In parallel with these operations, the atmosphere of the transfer chamber 206 is exhausted to have a pressure equal to or lower than the pressure of the adjacent vacuum transfer chamber 140.

Next, the gate valve 149 is opened to communicate the transfer chamber 206 with the adjacent vacuum transfer chamber 140. Then, the vacuum transfer robot 170 extends the end effector 181 supporting the substrate S to the set target coordinate. Thereafter, the substrate S is placed on the lift pins 207.

By performing the control in this manner, even when the position of the substrate holder 215 is shifted due to thermal expansion, the distances $L_1$ and $L_2$ may always be made equal.

(Substrate Mounting Step S112)

A substrate mounting step S112 will be described. After the substrate S is placed on the lift pins 207, the substrate mounting stand 212 is raised to mount the substrate S on the substrate mounting surface 211 of the substrate holder 215.

(Substrate Processing Position Moving Step S114)

When the substrate S is mounted on the substrate mounting surface 211, the substrate mounting stand 212 is raised to a substrate processing position, as shown in FIG. 1. At this time, as shown in FIG. 4A, the distances $La_1$ and $La_2$ are equal to each other and the distances $Lb_1$ and $Lb_2$ are equal to each other.

(Film-Forming Step S116)

A film-forming step S116 will be described. When the substrate mounting stand 212 moves to the substrate processing position, the atmosphere is exhausted from the process chamber 201 through the exhaust pipe 272 to adjust the internal pressure of the process chamber 201.

Further, the substrate S is heated by the heater 213 in a state in which the substrate S is mounted on the substrate mounting surface 211. When the temperature of the substrate S reaches a predetermined temperature, for example, 500 degrees C. to 600 degrees C. while a pressure is adjusted to be a predetermined pressure, processing gases such as a monosilane gas and an oxygen gas are supplied from the gas supply part to the process chamber.

The supplied gases are supplied to the substrate S and are supplied between the substrate edge Se and the edge 215e of the substrate holder 215 and between the edge 215e and the edge 212e. A silicon-containing film is formed on the substrate S by the supplied monosilane gas and oxygen gas. The substrate S is processed until the silicon-containing film has a desired thickness. At this time, since the distances $La_1$ and $La_2$ are equal to each other and the distances $Lb_1$ and $Lb_2$ are equal to each other, the substrate edge Se can be processed uniformly in the circumferential direction. Further, since the distances La and Lb can be secured, the center and the edge Se of the substrate S can be processed uniformly.

(Transfer Position Moving Step S118)

A transfer position moving step S118 will be described. After a film having a desired film thickness is formed, the substrate mounting stand 212 is lowered to move to the transfer position P0 shown in FIG. 3. Therefore, the substrate S stands by in the transfer chamber 206.

(Substrate Unloading Step S120)

A substrate unloading step S120 will be described. When the substrate S is moved to a transfer position P0, the gate valve 149 is opened and the substrate S is unloaded from the transfer chamber 206 to the vacuum transfer chamber 140.

(Determining Step S122)

A determining step S122 will be described. When the RC unloading step S120 is completed, the process proceeds to a determining step S122. Here, after processing a predetermined number of substrates S, it is determined whether or not there is a substrate S to be processed next. When it is determined that n substrates, which are all the substrates in one lot, including substrates processed by the other RCs 200, have been processed, the process is ended. Alternatively, even if the n substrates have not been processed, the process is ended when there is no substrate S to be processed next. When there is a substrate S to be processed next, the process proceeds to the basic information extracting step S104.

According to the method described above, even when the substrate holder 215 is moved due to thermal expansion, the in-plane processing of the substrate can be made uniform. Further, since the processing can be performed with high reproducibility, the processing among a plurality of substrates can be made uniform.

Second Embodiment

Figure 11A:
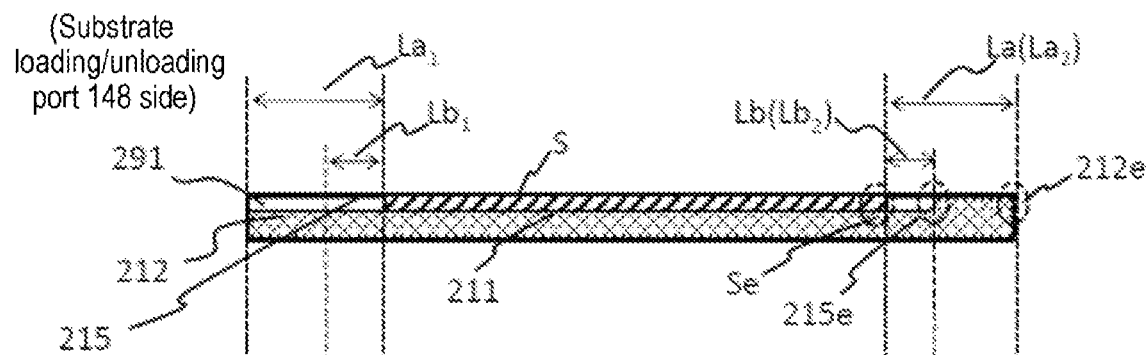
FIGS. 11A and 11B are explanatory views for explaining a substrate mounting stand.
Figure 11B:
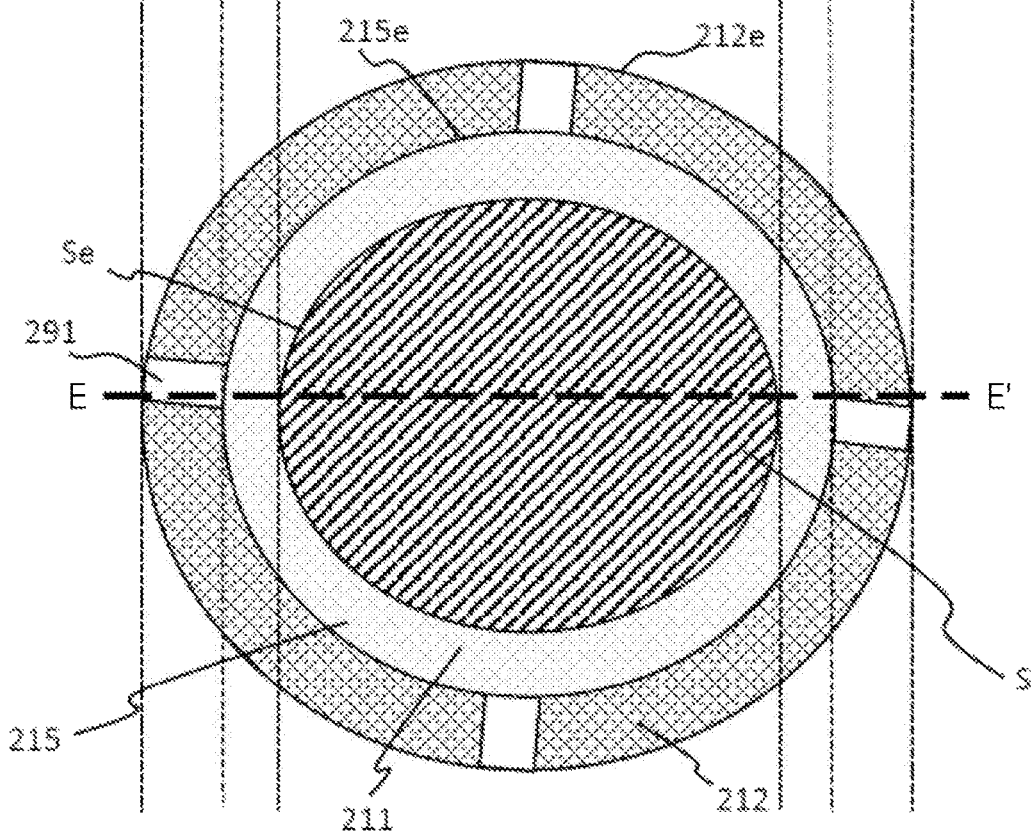

A second embodiment will be described with reference to FIGS. 11A and 11B. FIG. 11A is a side sectional view of the substrate mounting stand 212, and FIG. 11B is a top view thereof. FIG. 11A is a cross-sectional view taken along line E-E' in FIG. 11B. The elements which are the same as those of the first embodiment are denoted by the same reference numerals.

The second embodiment is different in a shape of the substrate mounting stand 212 from the first embodiment. Hereinafter, the description will be made while focusing on the difference.

Notches 291 are installed at the substrate mounting stand 212 of the present embodiment, as shown in FIGS. 11A and 11B. The notches 291 are uniformly arranged in the circumferential direction between the edge 212e of the substrate mounting stand 212 and the edge 215e. FIGS. 11A and 11B show four notches. The notches 291 are installed to prevent an excessive gas from staying in the substrate holder 215.

Even in this embodiment, as in the first embodiment, the robot 170 is controlled to place the substrate S at the center of the substrate mounting surface 211 even after thermal expansion. By doing this, since each of the distance $La_1$ and the distance $La_2$ can be made constant in the circumferential direction in the notches 291, the substrate edge Se can be uniformly processed in the circumferential direction while preventing an excessive gas from staying in the substrate holder 215.

As described above, even with the substrate processing apparatus having the notches 291, the substrate S can be processed uniformly.

Third Embodiment

Figure 12A:
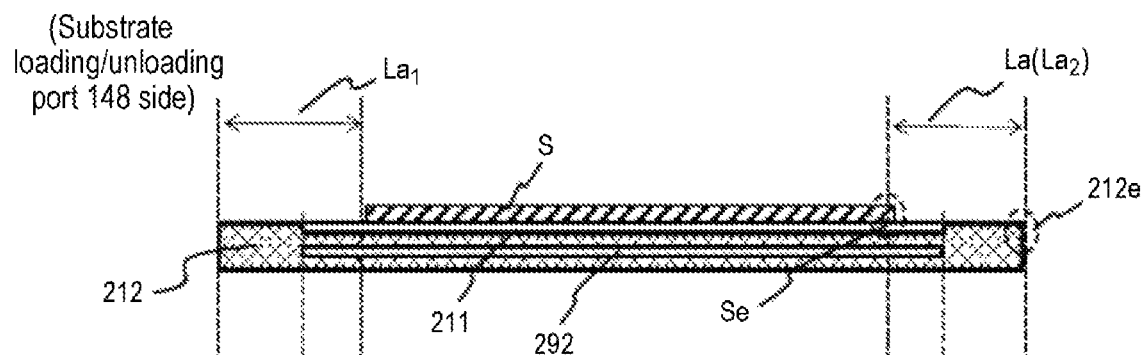
FIGS. 12A and 12B are explanatory views for explaining a substrate mounting stand.
Figure 12B:
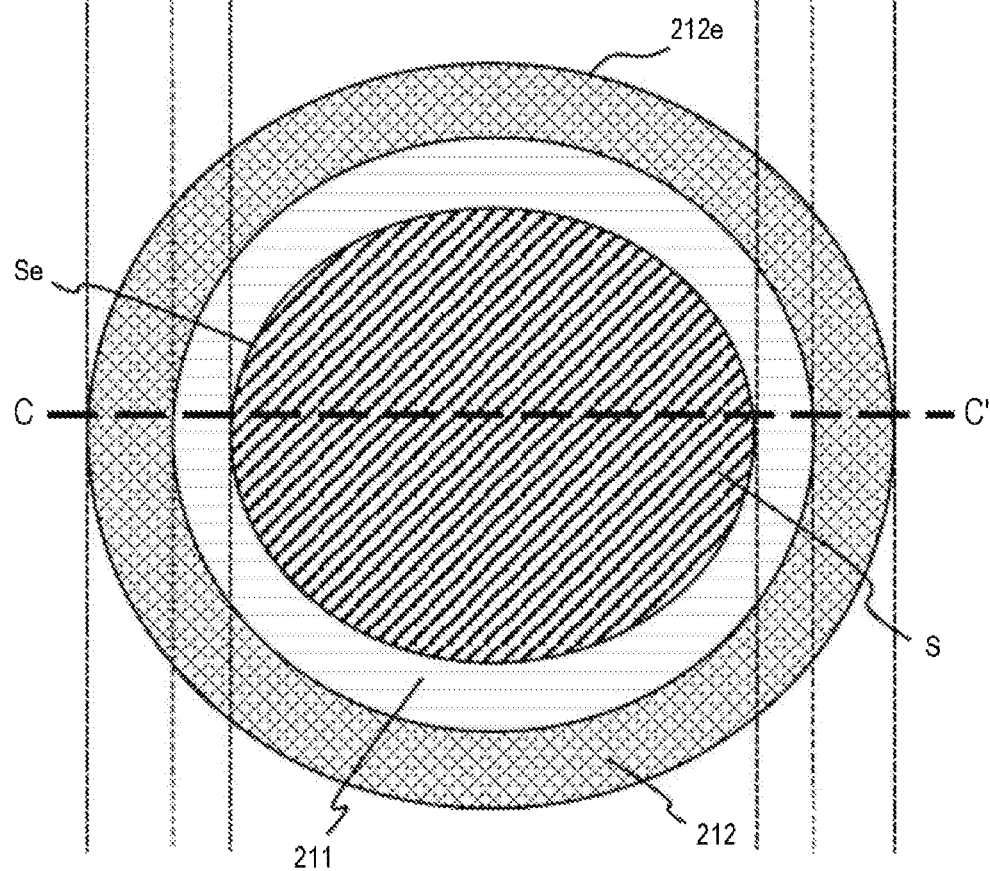

A third embodiment will be described with reference to FIGS. 12A and 12B. In the third embodiment, an electrode 292 for adsorbing the substrate S is installed at the substrate mounting stand 212 without installing the substrate holder 215 of the first embodiment. Hereinafter, the description will be made while focusing on the difference.

The substrate S is adsorbed on the substrate mounting surface 211 by the electrode 292, whereby the substrate S does not slide. Therefore, the substrate S can be placed at the same height as the edge 212e.

Even in this embodiment, as in the first embodiment, the robot 170 is controlled to place the substrate S at the center of the substrate mounting surface 211 even after thermal expansion. By doing this, since each of the distance $La_1$ and the distance $La_2$ can be made constant in the circumferential direction, the substrate edge Se can be uniformly processed in the circumferential direction.

As described above, even in the structure in which the substrate S is placed at the same height as the edge 212e, the substrate S can be processed uniformly.

Fourth Embodiment

A fourth embodiment will be described with reference to FIG. 13. The fourth embodiment is different from the first embodiment in that a coordinate table 413 illustrated in FIG. 13 is used instead of the coordinate table 412 of the first embodiment. Also in the configuration of the controller 400 in FIG. 7, the coordinate table 413 is used instead of the coordinate table 412. The other configurations are the same as those of the first embodiment. Hereinafter, the description will be made while focusing on the difference The coordinate table 413 includes recipe information as the basic information. Further, the coordinate table 413 further includes substrate temperature information for each recipe. The substrate temperature information is information for managing the processing temperature of the substrate S, for example, the temperature of the heater 213. Estimated position information is the center coordinate of the substrate holder 215 moved due to thermal expansion, and a target coordinate is the target coordinate of the end effector 181.

The column in the coordinate table 413 represents a type of recipe. Each recipe differs in at least the temperature at which the substrate S is processed. For example, Recipe 1, Recipe p and Recipe q are recipes for processing the substrate S at 400 degrees C., 550 degrees C., and 750 degrees C., respectively. These recipes are determined from the substrate processing information received by the calculation part 408 from the host device 284.

In that the temperature is set by each recipe, similarly to the coordinate table 412, positional information of a movement destination of the substrate holder 215 is estimated. Therefore, the target coordinate of the end effector 181 is set from the type of recipe.

Next, a substrate processing process in the present embodiment will be described with reference to FIG. 10. In the substrate processing process, the basic information extracting step S104 to the target coordinate setting step S108 differ. Hereinafter, the description will be made while focusing on the difference.

(Basic Information Extracting Step S104)

The basic information extracting step S104 of this embodiment will be described. Here, it is determined which recipe the substrate S is to be processed with. First, the CPU 401 determines which recipe the substrate S is to be processed with, based on the substrate processing information received from the host device 284, and sets a process. The extraction part 407 extracts the set recipe information as the basic information.

(Determining Step S106)

The determining step S106 of the present embodiment will be described. Here, it is determined whether to set the target coordinate of the end effector 181. When loading and processing the substrate S for the first time or when executing a recipe which is different in a thermal influence from the recipe of the previously processed substrate, it is determined that the thermal expansion level has an effect on the yield and it is necessary to reset the target coordinate, and the process proceeds to the target coordinate setting step S108.

When the temperature set in the recipe for processing the next substrate is at the same level of thermal effect as the recipe for the previously processed substrate, it is determined that the temperature is not at the thermal expansion level that has an effect on the yield and it is unnecessary to reset the target coordinate, and the process proceeds to the substrate transferring step S110.

The thermal effect described here is the effect of heat on a metal component, for example, in consideration of the processing temperature of the substrate, the processing time at that temperature, and the like.

(Target Coordinate Setting Step S108)

The target coordinate setting step S108 in the present embodiment will be described. When a result of the determination in the determining step S106 is "Yes," the process proceeds to the target coordinate setting step S108. Here, the calculation part 408 uses the coordinate table 413 to calculate the target coordinate of the end effector 181 corresponding to the value detected in the basic information extracting step S104.

By doing this, even when the processing temperature is changed depending on a recipe, the robot 170 is controlled to place the substrate S at the center of the substrate mounting surface 211. Therefore, each of the distance $La_1$ and the distance $La_2$ can be made constant in the circumferential direction, and the substrate edge Se can be processed uniformly in the circumferential direction.

Further, since the target coordinate can be set according to the recipe, the yield can be improved without newly installing a detection part such as the temperature measuring device 235 or the like.

OTHER EMBODIMENTS

Although the embodiments have been specifically described above, the present technique is not limited to the above-described embodiments, but various modifications can be made without departing from the scope and spirit of the present disclosure.

For example, in the above-described embodiments, the positional shift is measured by measuring the temperature of the container 202. However, the present disclosure is not limited thereto. For example, a positional shift sensor may be used for the container 202 to sense the positional shift. As the positional shift sensor, for example, a reflection sensor 261 or the like may be installed in the vicinity of the substrate mounting stand 212.

In the film-forming process performed by the substrate processing apparatus, examples have been described in which a film is formed using a monosilane gas as a first element-containing gas (first processing gas) and an $O_2$ gas as a second element-containing gas (second processing gas). However, the present disclosure is not limited thereto, but other types of gases may be used to form other types of thin films.

Further, although an example in which two types of gases are supplied has been described above, the present disclosure is not limited thereto, but one type of gas or three or more types of gases may be supplied to form a film.

Although "the same," "equal," and "constant" are expressed in the above embodiments, the present disclosure is limited to completely "the same," "equal" and "constant." As long as there is no influence on the yield, a range of substantially "the same," "equal," and "constant" is also included.

According to the present disclosure in some embodiments, it is possible to improve the quality of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a reactor including a process chamber in which a substrate is processed, the reactor being fixed to a vacuum transfer chamber;
a substrate mounting stand disposed in the reactor and having a substrate mounting surface on which the substrate is mounted;
a heater configured to heat the substrate;
a gas supply part configured to supply a gas into the process chamber;
a transfer robot disposed in the vacuum transfer chamber and including an end effector supporting the substrate when the substrate is transferred; and
a controller configured to perform control to:
extract basic information, which includes information corresponding to temperature information of the reactor, for estimating a position of the substrate mounting surface;
estimate position information of a center of the substrate mounting surface, which is moved by thermal expansion of the reactor, based on the basic information;
set a target coordinate of the end effector according to the estimated position information;
move the end effector to the target coordinate; and
mount the substrate on the substrate mounting surface,
wherein the controller is further configured to control the movement of the end effector to position the substrate on the substrate mounting surface such that a center of the substrate overlaps with the center of the substrate mounting surface, whereby a distance between an edge of the substrate and an edge of the substrate mounting stand is constant in a circumferential direction.

2. The substrate processing apparatus of claim 1, wherein the basic information is information of a recipe.

3. The substrate processing apparatus of claim 1, wherein the substrate mounting surface is formed at a bottom of a concave portion formed in the substrate mounting stand, and
wherein the controller is further configured to control the movement of the end effector to position the substrate on the substrate mounting surface such that the center of the substrate overlaps with a center of the concave portion, whereby a distance between the edge of the substrate and an edge of the concave portion is constant in the circumferential direction.

4. The substrate processing apparatus of claim 2, wherein the substrate mounting surface is formed at a bottom of a concave portion formed in the substrate mounting stand, and
wherein the controller is further configured to control the movement of the end effector to position the substrate on the substrate mounting surface such that the center of the substrate overlaps with a center of the concave portion, whereby a distance between the edge of the substrate and an edge of the concave portion is constant in the circumferential direction.

5. The substrate processing apparatus of claim 1, wherein the basic information further includes position information of the substrate mounting stand.

6. The substrate processing apparatus of claim 5, wherein the substrate mounting surface is formed at a bottom of a concave portion formed in the substrate mounting stand, and
wherein the controller is further configured to control the movement of the end effector to position the substrate on the substrate mounting surface such that the center of the substrate overlaps with a center of the concave portion, whereby a distance between the edge of the substrate and an edge of the concave portion is constant in the circumferential direction.

* * * * *